United States Patent
Nishimura et al.

(10) Patent No.: US 10,651,113 B2
(45) Date of Patent: May 12, 2020

(54) SEMICONDUCTOR APPARATUS, IGNITION DEVICE FOR INTERNAL COMBUSTION ENGINE, AND INTERNAL COMBUSTION ENGINE SYSTEM

(71) Applicant: Mitsubishi Electric Corporation, Tokyo (JP)

(72) Inventors: Kazuhiro Nishimura, Fukuoka (JP); Atsunobu Kawamoto, Tokyo (JP); Koji Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/082,252

(22) PCT Filed: May 31, 2016

(86) PCT No.: PCT/JP2016/066026
§ 371 (c)(1),
(2) Date: Sep. 4, 2018

(87) PCT Pub. No.: WO2017/208343
PCT Pub. Date: Dec. 7, 2017

(65) Prior Publication Data
US 2019/0080986 A1 Mar. 14, 2019

(51) Int. Cl.
*H01L 23/495* (2006.01)
*H01L 23/48* (2006.01)
(Continued)

(52) U.S. Cl.
CPC .............. *H01L 23/48* (2013.01); *H01L 23/00* (2013.01); *H01L 23/62* (2013.01); *H01L 24/42* (2013.01);
(Continued)

(58) Field of Classification Search
CPC ......... H01L 23/00; H01L 23/48; H01L 23/62; H01L 24/42
(Continued)

(56) References Cited

U.S. PATENT DOCUMENTS 5,424,896 A   6/1995  Pasch et al.
5,969,924 A * 10/1999 Noble ....................... H01T 4/08
                                                        29/829

(Continued)

FOREIGN PATENT DOCUMENTS

JP          4957183 B2     6/2012

OTHER PUBLICATIONS

International Search Report issued in PCT/JP2016/066026; dated Aug. 9, 2016.
(Continued)

*Primary Examiner* — Luan C Thai
(74) *Attorney, Agent, or Firm* — Studebaker & Brackett PC

(57) ABSTRACT

An end of a high-voltage electrode (5) is connected to a high-voltage terminal of a semiconductor device (1). An end of a low-voltage electrode (6) is connected to a low-voltage terminal of the semiconductor device (1). A resin (15) seals the semiconductor device (1), the end of the high-voltage electrode (5), and the end of the low-voltage electrode (6). A first discharge electrode (16) is provided to a portion of the high-voltage electrode (5) not covered by the resin (15). A second discharge electrode (17) is provided to a portion of the low-voltage electrode (6) not covered by the resin (15). The first and second discharge electrodes (16,17) protrude to face each other.

21 Claims, 3 Drawing Sheets

(51) Int. Cl.
*H01L 23/62* (2006.01)
*H01L 23/00* (2006.01)

(52) U.S. Cl.
CPC ............... *H01L 2224/48137* (2013.01); *H01L 2224/48247* (2013.01); *H01L 2224/49113* (2013.01); *H01L 2224/49175* (2013.01); *H01L 2924/00014* (2013.01); *H01L 2924/13055* (2013.01)

(58) Field of Classification Search
USPC ......................................................... 257/692
See application file for complete search history.

(56) References Cited

U.S. PATENT DOCUMENTS

| 7,233,062 B2* | 6/2007 | Abraham | ................ H01L 23/62 257/659 |
| 7,787,225 B2 | 8/2010 | Nishimura | |

OTHER PUBLICATIONS

Written Opinion issued in PCT/JP2016/066026; dated Aug. 9, 2016.
Notification of Transmittal of the International Search Report and the Written Opinion of the International Searching Authority, or the Declaration issued in PCT/JP2016/066026; dated Aug. 9, 2016.
An Office Action mailed by the Japanese Patent Office dated Dec. 4, 2018, which corresponds to Japanese Patent Application No. 2018-520244 and is related to U.S. Appl. No. 16/082,252.

* cited by examiner

PLAN VIEW

CROSS SECTION

SEMICONDUCTOR APPARATUS, IGNITION DEVICE FOR INTERNAL COMBUSTION ENGINE, AND INTERNAL COMBUSTION ENGINE SYSTEM

FIELD

The present invention relates to a semiconductor apparatus employed in an ignition system of an internal combustion engine such as a car engine, an ignition device for an internal combustion engine, and an internal combustion engine system.

BACKGROUND

A semiconductor apparatus that drives an inductive load (transformer coil) of, for example, an ignition system for an internal combustion engine uses the mutual inductive effects of the transformer coil to cause a spark discharge of several tens kV at a spark plug connected to the secondary side of the transformer coil to cause ignition. The apparatus is therefore required to have a surge withstand capacity of several to several tens kV because unexpected surges occur irregularly at a high-voltage terminal.

Techniques developed for the purpose of reducing the apparatus size and increasing the functionality of semiconductor apparatuses for internal combustion applications have been known, wherein a power semiconductor device and a backside high withstand voltage integrated circuit that controls the former are mounted on one conductor plate with a conductive bonding material (see, for example, PTL 1).

CITATION LIST

Patent Literature

[PTL1] Japanese Patent No. 4957183

SUMMARY

Technical Problem

A surge voltage applied to an electrode of the semiconductor apparatus could destroy the power semiconductor device and internal components of backside high withstand voltage integrated circuit. Therefore, the power semiconductor device needs to be equipped therein with surge-protection passive components such as diodes or resistors, and surge absorption areas or the like for absorbing hole currents (surge currents) that flow from a backside electrode inside the power semiconductor device when a surge voltage is applied. This led to the problem that the higher the surge withstand capacity the power semiconductor device and backside high withstand voltage integrated circuit were designed to have, the larger their device size would become.

The present invention was made to solve the problem described above and it is an object of the invention to obtain a semiconductor apparatus that has improved reliability against surge events and enables reduction of the entire apparatus size, an ignition device for an internal combustion engine, and an internal combustion engine system.

Solution to Problem

A semiconductor apparatus according to the present invention includes: a semiconductor device having a high-voltage terminal and a low-voltage terminal; a high-voltage electrode having an end connected to the high-voltage terminal; a low-voltage electrode having an end connected to the low-voltage terminal; a resin sealing the semiconductor device, the end of the high-voltage electrode, and the end of the low-voltage electrode; a first discharge electrode provided to a portion of the high-voltage electrode not covered by the resin; and a second discharge electrode provided to a portion of the low-voltage electrode not covered by the resin, wherein the first and second discharge electrodes protrude to face each other.

Advantageous Effects of Invention

In the present invention, the first discharge electrode and the second discharge electrode are provided to portions of the high-voltage electrode and low-voltage electrode not covered by the resin and protrude to face each other. Therefore, reliability against surge events can be improved and the entire apparatus size can be reduced.

DESCRIPTION OF EMBODIMENTS

A semiconductor apparatus, an ignition device for an internal combustion engine, and an internal combustion engine system according to the embodiments of the present invention will be described with reference to the drawings. The same components will be denoted by the same symbols, and the repeated description thereof may be omitted.

Embodiment 1

Figure 1:
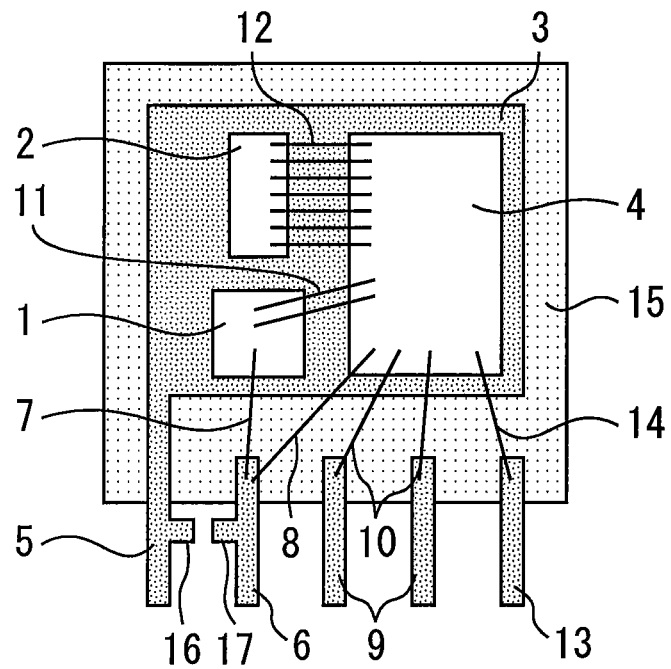
FIG. 1 is a plan view illustrating a semiconductor apparatus according to Embodiment 1 of the present invention.

FIG. 1 is a plan view illustrating a semiconductor apparatus according to Embodiment 1 of the present invention. This semiconductor apparatus is applied to an ignition device for an internal combustion engine, or an internal combustion engine system, and drives an inductive load (transformer coil).

A power semiconductor device 1 and a backside high withstand voltage integrated circuit 2 that controls the power semiconductor device 1 are mounted on one conductor plate 3 with a conductive bonding material. An insulating substrate 4 carrying passive components such as resistors and capacitors thereon is mounted on the conductor plate 3 with a non-conductive bonding material. The power semiconductor device 1 is an IGBT.

One end of a high-voltage electrode 5 is connected to a collector terminal that is the high-voltage terminal of the power semiconductor device 1 via the conductor plate 3.

One end of a low-voltage electrode 6 is connected to an emitter terminal that is the low-voltage terminal of the power semiconductor device 1 and to the insulating substrate 4 via wires 7 and 8, respectively. The low-voltage electrode 6 is connected to GND.

One end of a control electrode 9 is connected to the insulating substrate 4 via a wire 10. The insulating substrate 4 is connected to a gate terminal that is the control terminal of the power semiconductor device 1 and to the backside high withstand voltage integrated circuit 2 via wires 11 and 12, respectively. One end of a power supply electrode 13 that supplies power to the insulating substrate 4 is connected to the insulating substrate 4 via a wire 14. Resin 15 seals the power semiconductor device 1, the backside high withstand voltage integrated circuit 2, the conductor plate 3, one end of the high-voltage electrode 5, one end of the low-voltage electrode 6, one end of the control electrode 9, one end of the power supply electrode 13, and the wires 7, 8, 10, 11, 12, and 14.

A first discharge electrode 16 and a second discharge electrode 17 are provided to side faces of portions of the high-voltage electrode 5 and low-voltage electrode 6 respectively not covered by the resin 15 and protrude to face each other. When a surge voltage is applied to the high-voltage electrode 5, the surge currents can flow to the low-voltage electrode 6 via the first and second discharge electrodes 16 and 17. Since the surge voltage is limited by the voltage value set by the first and second discharge electrodes 16 and 17, the surge voltage applied to the power semiconductor device 1 and backside high withstand voltage integrated circuit 2 can be restricted, and thus the reliability against surge is improved.

The power semiconductor device 1 and the backside high withstand voltage integrated circuit 2 will have to be increased in apparatus size if they are designed to have a higher surge withstand capability. Since the surge voltage can be limited according to this embodiment, these devices can be reduced in size, which in turn enables size reduction of the entire semiconductor apparatus.

If the discharge voltage of the first and second discharge electrodes 16 and 17 is substantially equal to the general withstand voltage of the semiconductor apparatus, smooth ignition cannot be expected. The discharge voltage therefore needs to be set sufficiently higher (ten times or more) than the general withstand voltage of the semiconductor apparatus. On the other hand, the power semiconductor device 1 and backside high withstand voltage integrated circuit 2 need to be designed such that there is a margin between their surge withstand capacity and the discharge voltage, so as to prevent destruction of the devices.

Embodiment 2

Figure 2:
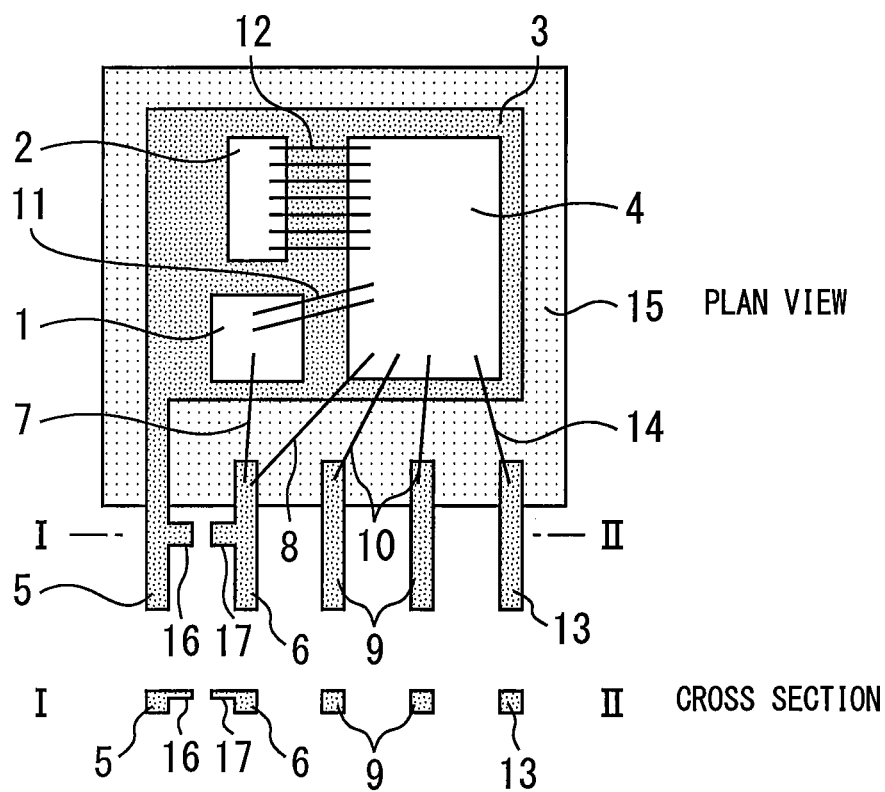
FIG. 2 is a plan view and a I-II cross section illustrating a semiconductor apparatus according to Embodiment 2 of the present invention.

FIG. 2 is a plan view and a I-II cross section illustrating a semiconductor apparatus according to Embodiment 2 of the present invention. The thicknesses of first and second discharge electrodes 16 and 17 are smaller than those of the high-voltage electrode 5 and low-voltage electrode 6. Electric fields thus concentrate more readily at the first and second discharge electrodes 16 and 17. Therefore, more stable discharge characteristics can be obtained, and the reliability against surge is improved.

Embodiment 3

Figure 3:
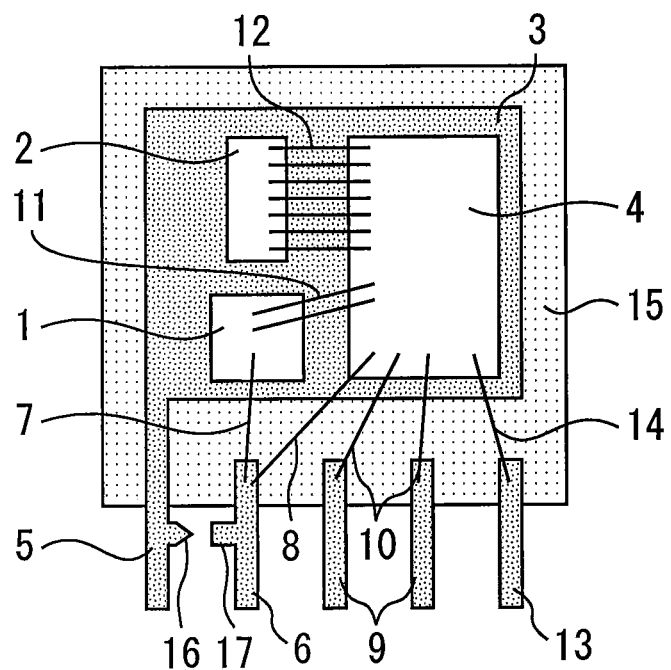
FIG. 3 is a plan view illustrating a semiconductor apparatus according to Embodiment 3 of the present invention.

FIG. 3 is a plan view illustrating a semiconductor apparatus according to Embodiment 3 of the present invention.

The first discharge electrode 16 is processed to have a sharp-angled distal end. Therefore, more stable discharge characteristics can be obtained, and the reliability against surge is improved. The same effects can be achieved by processing the second discharge electrode 17 to have a sharp-angled distal end.

Figure 4:
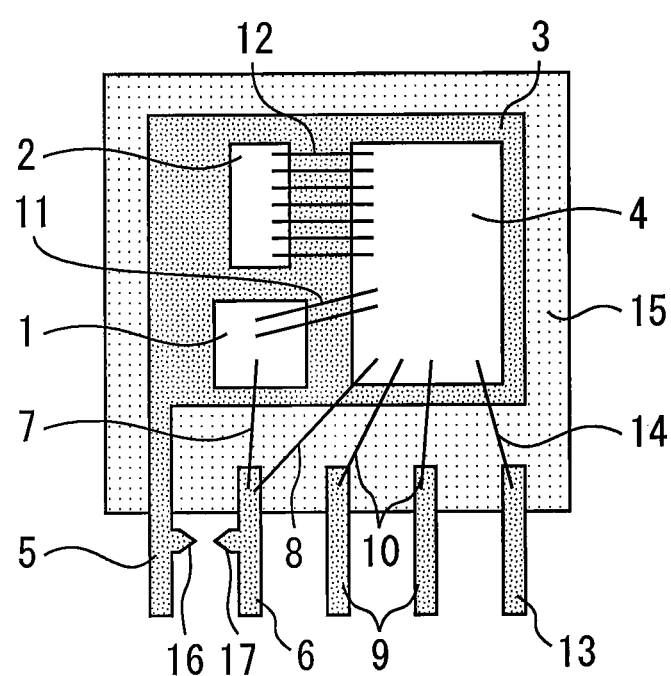
FIG. 4 is a plan view illustrating a modified example of the semiconductor apparatus according to Embodiment 3 of the present invention.

FIG. 4 is a plan view illustrating a modified example of the semiconductor apparatus according to Embodiment 3 of the present invention. Both of the first and second discharge electrodes 16 and 17 are processed to have a sharp-angled distal end. Therefore, the discharge characteristics are made more stable than those of the configuration shown in FIG. 3, and the reliability against surge is improved.

Embodiment 4

Figure 5:
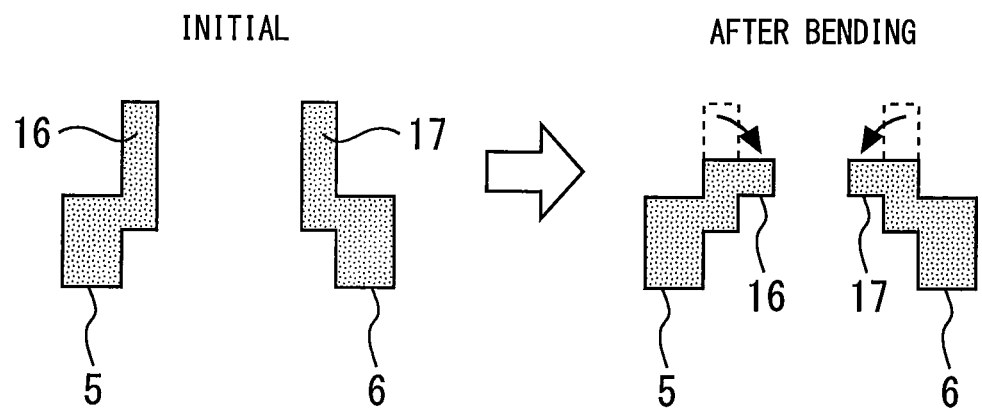
FIG. 5 is a cross-sectional view illustrating the first and second discharge electrodes of a semiconductor apparatus according to Embodiment 4 of the present invention to a larger scale.

FIG. 5 is a cross-sectional view illustrating the first and second discharge electrodes of a semiconductor apparatus according to Embodiment 4 of the present invention to a larger scale. The distal ends of the first and second discharge electrodes 16 and 17 are bent. The bending enables adjustment of the distance between both electrodes to set the discharge voltage as required, and thus the degree of design freedom is improved.

Embodiment 5

Figure 6:
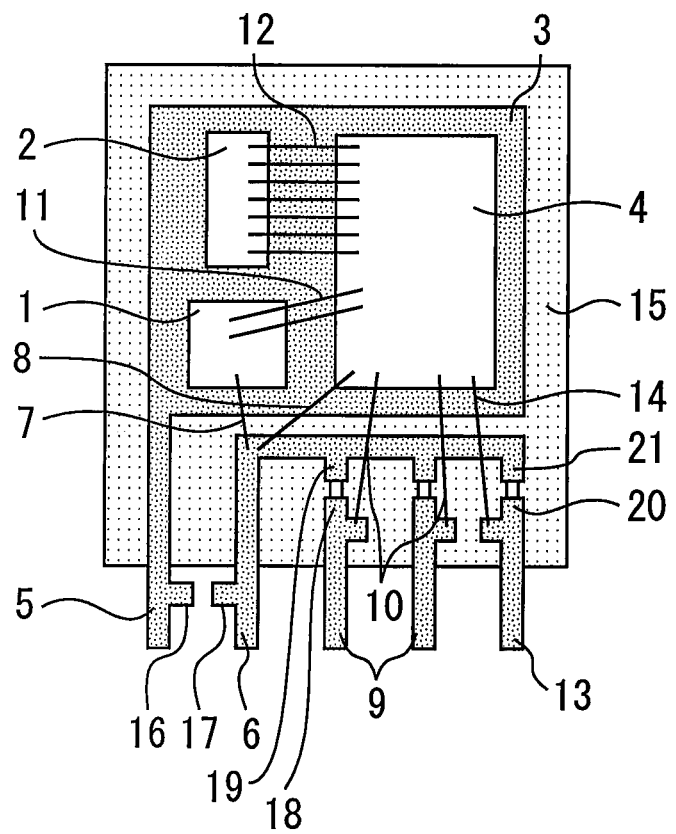
FIG. 6 is a plan view illustrating a semiconductor apparatus according to Embodiment 5 of the present invention.

FIG. 6 is a plan view illustrating a semiconductor apparatus according to Embodiment 5 of the present invention. A third discharge electrode 18 and a fourth discharge electrode 19 are provided to the control electrode 9 and low-voltage electrode 6, respectively, and protrude to face each other. A fifth discharge electrode 20 and a sixth discharge electrode 21 are provided to the power supply electrode 13 and low-voltage electrode 6, respectively, and protrude to face each other. Therefore, even when a surge occurs in the control electrode 9 or power supply electrode 13, the surge currents can flow to the low-voltage electrode 6, so that destruction of passive components carried on the insulating substrate 4 is prevented. Thus the reliability against surge is improved.

The power semiconductor device 1 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization of the semiconductor device in which the semiconductor device is incorporated. Further, since the semiconductor device has a high heat resistance, a radiation fin of a heatsink can be miniaturized and a water-cooled part can be air-cooled, which leads to further miniaturization of the semiconductor device. Further, since the semiconductor device has a low power loss and a high efficiency, a highly efficient semiconductor device can be achieved.

REFERENCE SIGNS LIST 1 power semiconductor device; 4 insulating substrate; 5 high-voltage electrode; 6 low-voltage electrode; 9 control electrode; 13 power supply electrode; 15 resin; 16 first discharge electrode; 17 second discharge electrode; 18 third discharge electrode; 19 fourth discharge electrode; 20 fifth discharge electrode; 21 sixth discharge electrode

The invention claimed is:
1. A semiconductor apparatus comprising:
   a semiconductor device having a high-voltage terminal and a low-voltage terminal;
   a high-voltage electrode having an end connected to the high-voltage terminal;
   a low-voltage electrode having an end connected to the low-voltage terminal;
   a resin sealing the semiconductor device, the end of the high-voltage electrode, and the end of the low-voltage electrode;
   an insulating substrate;
   a first wire directly connecting the low-voltage electrode to the semiconductor device, and a second wire directly connecting the low-voltage electrode to the insulating substrate;
   a first discharge electrode provided to a portion of the high-voltage electrode not covered by the resin; and
   a second discharge electrode provided to a portion of the low-voltage electrode not covered by the resin,
   wherein the first and second discharge electrodes protrude to face each other.
2. The semiconductor apparatus according to claim 1, wherein thicknesses of first and second discharge electrodes are smaller than those of the high-voltage electrode and the low-voltage electrode.
3. The semiconductor apparatus according to claim 1, wherein at least one of the first and second discharge electrodes has a sharp-angled distal end.
4. The semiconductor apparatus according to claim 1, wherein the first discharge electrode has a distal end and the second discharge electrode has a distal end, and the distal ends of the first and second discharge electrodes are bent.
5. The semiconductor apparatus according to claim 1, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.
6. An ignition device for an internal combustion engine comprising a semiconductor apparatus including:
   a semiconductor device having a high-voltage terminal and a low-voltage terminal;
   a high-voltage electrode having an end connected to the high-voltage terminal;
   a low-voltage electrode having an end connected to the low-voltage terminal;
   a resin sealing the semiconductor device, the end of the high-voltage electrode, and the end of the low-voltage electrode;
   an insulating substrate;
   a first wire directly connecting the low-voltage electrode to the semiconductor device, and a second wire directly connecting the low-voltage electrode to the insulating substrate;
   a first discharge electrode provided to a portion of the high-voltage electrode not covered by the resin; and
   a second discharge electrode provided to a portion of the low-voltage electrode not covered by the resin,
   wherein the first and second discharge electrodes protrude to face each other.
7. An internal combustion engine system comprising a semiconductor apparatus including:
   a semiconductor device having a high-voltage terminal and a low-voltage terminal;
   a high-voltage electrode having an end connected to the high-voltage terminal;
   a low-voltage electrode having an end connected to the low-voltage terminal;
   a resin sealing the semiconductor device, the end of the high-voltage electrode, and the end of the low-voltage electrode;
   an insulating substrate;
   a first wire directly connecting the low-voltage electrode to the semiconductor device, and a second wire directly connecting the low-voltage electrode to the insulating substrate;
   a first discharge electrode provided to a portion of the high-voltage electrode not covered by the resin; and
   a second discharge electrode provided to a portion of the low-voltage electrode not covered by the resin,
   wherein the first and second discharge electrodes protrude to face each other.
8. The semiconductor apparatus according to claim 2, wherein at least one of the first and second discharge electrodes has a sharp-angled distal end.
9. The semiconductor apparatus according to claim 2, wherein the first discharge electrode has a distal end and the second discharge electrode has a distal end, and the distal ends of the first and second discharge electrodes are bent.
10. The semiconductor apparatus according to claim 3, wherein the first discharge electrode has a distal end and the second discharge electrode has a distal end, and the distal ends of the first and second discharge electrodes are bent.
11. The semiconductor apparatus according to claim 8, wherein the first discharge electrode has a distal end and the second discharge electrode has a distal end, and the distal ends of the first and second discharge electrodes are bent.
12. The semiconductor apparatus according to claim 2, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

13. The semiconductor apparatus according to claim 3, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

14. The semiconductor apparatus according to claim 8, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

15. The semiconductor apparatus according to claim 4, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

16. The semiconductor apparatus according to claim 9, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

17. The semiconductor apparatus according to claim 10, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

18. The semiconductor apparatus according to claim 11, further comprising:
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode;
   a fifth discharge electrode provided to the power supply electrode; and
   a sixth discharge electrode provided to the low-voltage electrode,
   wherein the third and fourth discharge electrodes protrude to face each other, and
   the fifth and sixth discharge electrodes protrude to face each other.

19. The semiconductor apparatus according to claim 1,
   a control electrode having an end connected to a control terminal of the semiconductor device via the insulating substrate;
   a power supply electrode supplying power to the insulating substrate;
   a third discharge electrode provided to the control electrode;
   a fourth discharge electrode provided to the low-voltage electrode; and
   a fifth discharge electrode provided to the power supply electrode;
   wherein the third, fourth and fifth discharge electrodes are in the resin.

20. The ignition device according to claim 6,
   a control electrode having an end connected to a control terminal of the semiconductor device via the insulating substrate;

a power supply electrode supplying power to the insulating substrate;

a third discharge electrode provided to the control electrode;

a fourth discharge electrode provided to the low-voltage electrode; and a fifth discharge electrode provided to the power supply electrode;

wherein the third, fourth and fifth discharge electrodes are in the resin.

21. The internal combustion engine system according to claim 7, a control electrode having an end connected to a control terminal of the semiconductor device via the insulating substrate;

a power supply electrode supplying power to the insulating substrate;

a third discharge electrode provided to the control electrode;

a fourth discharge electrode provided to the low-voltage electrode; and a fifth discharge electrode provided to the power supply electrode;

wherein the third, fourth and fifth discharge electrodes are in the resin.

\* \* \* \* \*